US009806161B1

(12) United States Patent
Khan et al.

(10) Patent No.: US 9,806,161 B1
(45) Date of Patent: Oct. 31, 2017

(54) INTEGRATED CIRCUIT STRUCTURE HAVING THIN GATE DIELECTRIC DEVICE AND THICK GATE DIELECTRIC DEVICE

(71) Applicant: GLOBALFOUNDRIES INC., Grand Cayman (KY)

(72) Inventors: Shahrukh A. Khan, Danbury, CT (US); Unoh Kwon, Fishkill, NY (US); Shahab Siddiqui, White Plains, NY (US); Sean M. Polvino, Watertown, MA (US); Joseph F. Shepard, Jr., Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/092,910

(22) Filed: Apr. 7, 2016

(51) Int. Cl.
| | |
|---|---|
| *H01L 29/423* | (2006.01) |
| *H01L 21/311* | (2006.01) |
| *H01L 29/51* | (2006.01) |
| *H01L 21/033* | (2006.01) |
| *H01L 21/84* | (2006.01) |
| *H01L 21/027* | (2006.01) |
| *H01L 21/8234* | (2006.01) |
| *H01L 27/12* | (2006.01) |

(52) U.S. Cl.
CPC .... *H01L 29/42364* (2013.01); *H01L 21/0273* (2013.01); *H01L 21/0332* (2013.01); *H01L 21/31133* (2013.01); *H01L 21/31144* (2013.01); *H01L 21/823462* (2013.01); *H01L 21/845* (2013.01); *H01L 27/1207* (2013.01); *H01L 29/511* (2013.01); *H01L 29/518* (2013.01)

(58) Field of Classification Search
CPC .................................. H01L 29/42364
USPC ........................................ 257/392
See application file for complete search history.

(56) References Cited

U.S. PATENT DOCUMENTS

| | | | |
|---|---|---|---|
| 2004/0023475 A1* | 2/2004 | Bonser .............. | H01L 21/32139 438/585 |
| 2011/0001179 A1* | 1/2011 | Yanagi .............. | G11C 16/0408 257/316 |
| 2012/0132998 A1* | 5/2012 | Kwon .............. | H01L 21/28088 257/369 |
| 2014/0001570 A1* | 1/2014 | Brodsky .......... | H01L 21/02321 257/392 |
| 2014/0103404 A1* | 4/2014 | Li ................... | H01L 21/823842 257/288 |
| 2014/0162414 A1* | 6/2014 | Pradhan ........... | H01L 21/31122 438/151 |

* cited by examiner

*Primary Examiner* — Moazzam Hossain
*Assistant Examiner* — Omar Mojaddedi
(74) *Attorney, Agent, or Firm* — Yuanmin Cai; Hoffman Warnick LLC (57) ABSTRACT

One aspect of the disclosure relates to and integrated circuit structure and methods of forming the same. The integrated circuit structure may include: a thin gate dielectric device on a substrate, the thin gate dielectric device including: a first interfacial layer over a set of fins within the substrate, wherein the interfacial layer has a thickness of approximately 1.0 nanometers (nm) to approximately 1.2 nm; and a thick gate dielectric device on the substrate adjacent to the thin gate dielectric device, the thick gate dielectric device including: a second interfacial layer over the set of fins within the substrate; and a nitrided oxide layer over the second interfacial layer, wherein the nitrided oxide layer includes a thickness of approximately 3.5 nm to approximately 5.0 nm.

18 Claims, 6 Drawing Sheets

INTEGRATED CIRCUIT STRUCTURE HAVING THIN GATE DIELECTRIC DEVICE AND THICK GATE DIELECTRIC DEVICE

BACKGROUND

Technical Field

The present disclosure relates to integrated circuits, and more particularly, to integrated circuit structures having a thin gate dielectric device and a thick gate dielectric device, and a method of forming the same.

Related Art

In integrated circuit (IC) structures, a transistor is a critical component for implementing digital circuitry designs. Generally, a transistor includes three electrical terminals: a source, a drain, and a gate. By applying different voltages to the gate terminal, the flow of electric current from the source to the drain can be turned on and off. A common type of transistor is a metal oxide field effect transistor (MOSFET). One type of MOSFET structure is a "FINFET," typically formed upon a semiconductor-on-insulator (SOI) layer and buried insulator layer. A FINFET can include a semiconductor structure etched into a "fin" shaped body, with one side of the fin acting as a source terminal and the other side of the fin acting as a drain terminal. A gate structure, typically composed of polysilicon and/or a metal, can be formed around one or more of the semiconductor fins. The gate structure may typically include a gate dielectric and a gate conductor. In a FINFET, the gate dielectric may separate the gate conductor and the semiconductor fins. The gate dielectric may include, for example, an oxide. The gate conductor may include one or more conductive materials or layers including work function metal layers which effectively tune the work function of the gate structure. By applying a voltage to the gate structure, an electrically conductive channel can be created between the source and drain terminals of each fin in contact with the gate.

More than one gate structure (multi-gate or dual-gate) can be used to more effectively control the channel. Multi-gate FETs are considered to be promising candidates to scale down FET technology. However, the smaller dimensions associated with multi-gate FETs (as compared to single-gate FETs) necessitate greater control over performance issues such as short channel effects, punch-through, metal-oxide semiconductor (MOS) leakage current, and the parasitic resistance that is present in a multi-gate FET.

In a multi-gate FET, both a thin gate dielectric device and a thick gate dielectric device may be formed on the same semiconductor substrate. Thick and thin gate dielectric devices are so named due to the relative thickness of the gate dielectrics used in creating the gate structures for the FET devices. That is, in a multi-gate FINFET, one gate structure may have a thin gate dielectric separating the gate structure from the semiconductor fins thereunder, and another gate structure may have a thick gate dielectric separating the gate structure from the semiconductor fins thereunder. A thin gate dielectric may be used for a high performance logic transistor and may conventionally operate at about 0.9 volts (V), and a thick gate dielectric may be used for a high voltage input/output transistor used for analog, mixed signals, embedded Dynamic Random Access Memory (eDRAM) pass-gate, and system on chip applications, and may conventionally operate between about 1.5 V to about 3.0 V.

In manufacturing a FINFET having both types of gate dielectrics, i.e., a thin gate dielectric and a thick gate dielectric, an initial oxide is formed over the semiconductor fins. An oxide hard mask is generally formed on the top of the initial oxide over the semiconductor fin in the region which is to subsequently include the thick oxide device. The oxide hard mask protects the oxide over the semiconductor fin in the thick gate dielectric device region while thin gate dielectric device region undergoes additional processing, e.g., the removal of the initial oxide from over the semiconductor fin in the thin gate dielectric device region. While the oxide hard mask sufficiently protects the thick oxide device region during the processing of the thin oxide device region, the oxide hard mask must eventually be removed from the thick oxide device region in order to create the gate structure and complete the FINFET. Conventionally, during the deposition and removal of the oxide hard mask from the thick oxide device region, the initial oxide over the semiconductor fin in the thick oxide device region is reduced by about 2 Angstroms to about 3 Angstroms in thickness. That is, the deposition of the sacrificial oxide and subsequent removal of the same compromises the quality of the gate dielectric that needs to be retained and can lead to device and parametric shift from ideal characteristics desired.

SUMMARY

A first aspect of the disclosure relates to a method of forming an integrated circuit structure including a thin gate dielectric device region over a set of fins within a substrate and a thick gate dielectric device region over the set of fins within the substrate. The method may include: forming a nitrided oxide layer over each fin in the set of fins within the thin gate dielectric device region and the thick gate dielectric device region; forming a conformal carbon hard mask over the nitrided oxide layer within the thin gate dielectric device region and the thick gate dielectric device region; patterning a photoresist stack over the conformal carbon hard mask within the thin gate dielectric device region and the thick gate dielectric device region to expose the conformal carbon hard mask within the thin gate dielectric device region such that a remaining portion of the photoresist stack remains within the thick gate dielectric device region; removing the exposed conformal carbon hard mask from the thin gate dielectric device region such that a remaining portion of the conformal carbon hard mask remains within the thick gate dielectric device region covered by the remaining portion of the photoresist stack; removing the remaining portion of the photoresist stack from over the remaining portion of the conformal carbon hard mask within the thick gate dielectric device region; removing the remaining portion of the conformal carbon hard mask from the thick gate dielectric device region to expose the nitrided oxide within the thick gate dielectric device region; and forming an interfacial layer within the thin gate dielectric device region.

A second aspect of the disclosure relates to a method of forming an integrated circuit structure a thin gate dielectric device region over a set of fins within a substrate and a thick gate dielectric device region over the set of fins within the substrate. The method may include: forming a nitrided oxide layer over each fin in the set of fins within the thin gate dielectric device region and the thick gate dielectric device region; forming a conformal carbon hard mask over nitrided oxide layer within the thin gate dielectric device region and the thick gate dielectric device region; patterning a photoresist stack over the conformal carbon hard mask within the thin gate dielectric device region and the thick gate dielectric device region to expose the conformal carbon hard mask within the thin gate dielectric region such that a remaining portion of the photoresist stack remains within the thick gate dielectric device region; removing the exposed conformal carbon hard mask from the thin gate dielectric device region such that a remaining portion of the conformal carbon hard mask remains within the thick gate dielectric device region covered by the remaining portion of the photoresist stack; wet etching to remove the remaining portion of the photoresist stack from over the remaining conformal carbon hard mask within the thick gate dielectric device region; removing the nitrided oxide layer from the thin gate dielectric device region such that a remaining portion of the nitrided oxide layer remains within the thick gate dielectric device region covered by the remaining portion of the conformal carbon hardmask; ashing the remaining portion of the conformal carbon hard mask to remove the remaining portion of the conformal carbon hard mask from the thick gate dielectric device region to expose the nitrided oxide layer within the thick gate dielectric device region; and forming an interfacial layer within the thin gate dielectric device region.

A third aspect of the disclosure relates to an integrated circuit structure. The integrated circuit structure may include: a thin gate dielectric device on a substrate, the thin gate dielectric device including: a first interfacial layer over a set of fins within the substrate, wherein the interfacial layer has a thickness of approximately 1.0 nanometers (nm) to approximately 1.2 nm; and a thick gate dielectric device on the substrate adjacent to the thin gate dielectric device, the thick gate dielectric device including: a second interfacial layer over the set of fins within the substrate; and a nitrided oxide layer over the second interfacial layer, wherein the nitrided oxide layer includes a thickness of approximately 3.5 nm to approximately 5.0 nm.

BRIEF DESCRIPTION OF THE DRAWINGS

These and other features of this disclosure will be more readily understood from the following detailed description of the various aspects of the invention taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the invention. In the drawings, like numbering represents like elements between the drawings.

DETAILED DESCRIPTION

The present disclosure relates to integrated circuits (IC) structures, and more particularly, to integrated circuit structures having a thin gate dielectric device and a thick gate dielectric device, and a method of forming the same. Specifically, the present disclosure is directed to the use of a conformal carbon hard mask as an alternative to the conventional oxide hard mask. The conformal carbon hard mask, and processes discussed herein, sufficiently protect the thick gate dielectric device region during processing of the thin gate dielectric device region while avoiding the problems of thinning the thick gate dielectric device region during the removal of the conformal carbon hard mask.

Aspects of the present disclosure are shown and described with respect to a fin-shaped field-effect transistor (FINFET). However, it is to be understood that aspects of the present disclosure are equally applicable to other types of transistors, such as but not limited to field-effect transistors, including transistors with different geometrical orientations and shapes of their channels such as planar FETs, surround-gate FETs, multiple-gate FETs, nano-wire or nano-sheet FETs, and vertical FETs. It is also to be understood that the present disclosure is equally applicable to thin and thick gate dielectrics being formed with active gate conductors at the outset, as well as after removal of a dummy gate and prior to the formation of an active gate.

Figure 1:
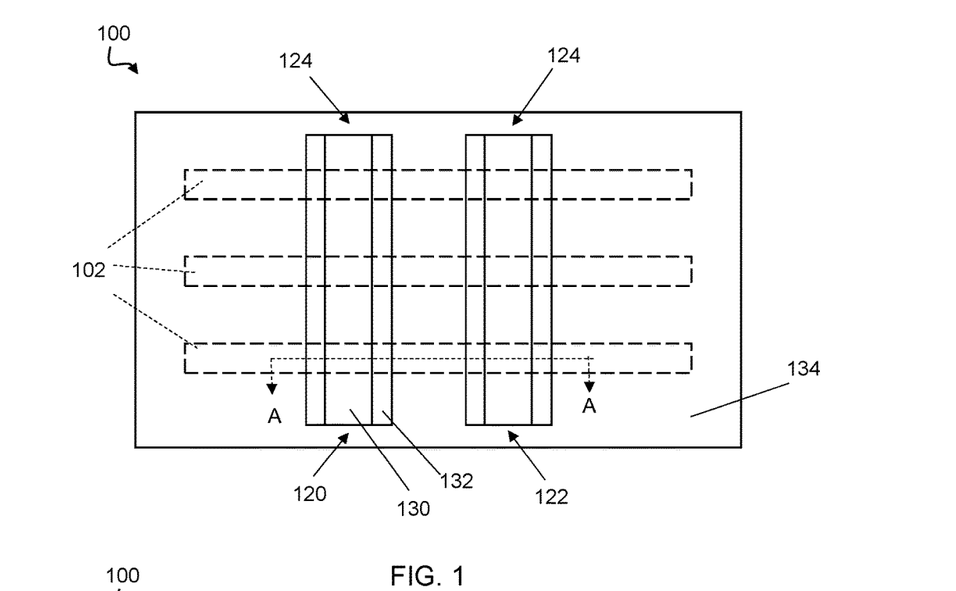
FIG. 1 shows a top-down view of a preliminary integrated circuit structure according to an embodiment of the disclosure.
Figure 2:
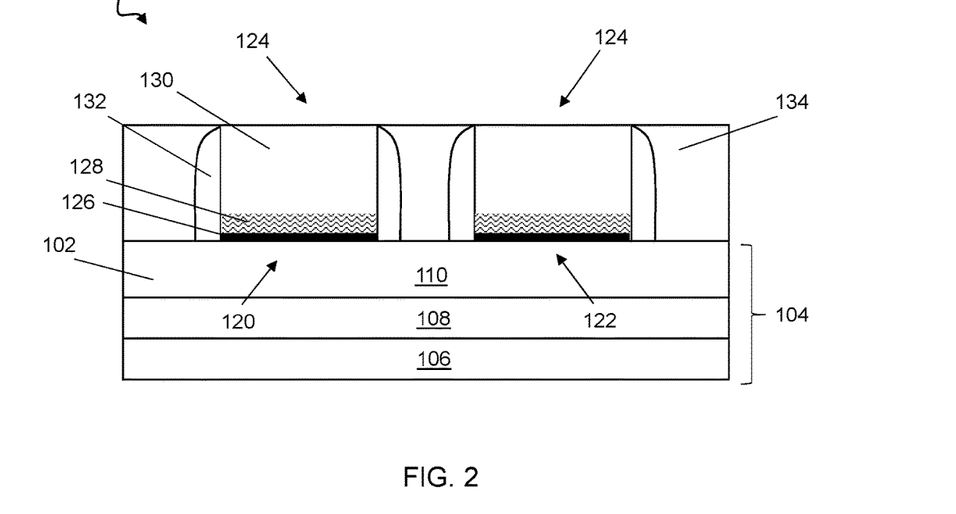
FIGS. 2-12 show cross-sectional views of an integrated circuit structure undergoing a method according to embodiments of the disclosure with FIG. 12 showing a cross-sectional view of an integrated circuit structure having a thin gate dielectric device and a thick gate dielectric device according to embodiments of the disclosure.

A top-down view of a preliminary integrated circuit structure is shown in FIG. 1. The integrated circuit structure may be shown as a fin-shaped field-effect-transistor (FINFET) 100. FIG. 2 shows a perspective view of a cross-section of FINFET 100 taken along line A-A. Referring to FIGS. 1-2 together, FINFET 100 may include at least one fin 102 formed within a substrate 104. In some embodiments (shown), substrate 104 may be a silicon-on-insulator (SOI) substrate. In such an embodiment, substrate 104 may include a semiconductor layer 106, a buried insulator layer 108 formed over semiconductor layer 106, and a SOI layer 110 formed over buried insulator layer 106. In another embodiment (not shown), substrate 104 may be a bulk silicon substrate from which fins 102 are formed. It is to be understood that fins 102 may include doped regions (not shown) that may constitute the other parts of a transistor, e.g., channels, sources, and drains.

Semiconductor layer 106 and SOI layer 110 may each include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor layer 106 and SOI layer 110 may be strained. Buried insulator 108 may include, for example, silicon dioxide or (less commonly) sapphire. The choice of insulator depends largely on intended application, with sapphire being used for radiation-sensitive applications and silicon oxide preferred for improved performance and diminished short channel effects in microelectronics devices.

Each layer 106, 108, 110 may be formed using any now known or later developed technique such as sequential deposition of material. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), reaction processing CVD (RP-CVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. It will be understood that when an element as a layer, region or substrate is referred as being "on" or "over" another element, it can be directly on the other element or intervening elements may be present. It will also be understood that when an element is referred to as being "connected" or "coupled" to another element, it can be directly connected or couple to the other element or intervening elements may be present.

Fins 102 may be formed from SOI layer 110 using any now known or later developed photolithographic technique, e.g., depositing a mask (not shown), patterning the mask, etching the mask, and etching layer 110 to form fins 102 (e.g., reactive ion etching (RIE)). "Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. As shown, fin formation typically result in a number of spaced fins 102 atop buried insulator layer 108.

FINFET 100 may be a dual gate FINFET such that FINFET 100 includes two gates. As shown in FIGS. 1-2, FINFET 100 may include a thin gate dielectric device region 120 and a thick gate dielectric device region 122. As will be described herein, a thin gate dielectric device may be formed in thin gate dielectric device region 120 and a thick gate device may be formed in thick gate dielectric device region 122. In each region 120, 122, a dummy gate structure 124 may be formed perpendicularly over each fin 102 such that each dummy gate structure 124 wraps around each fin 102 as known in the art. Dummy gate structure 124 may include an interfacial layer 126 over each fin 102 and a nitrided oxide layer 128 over interfacial layer 126. Interfacial layer 126 may include, for example, silicon dioxide and/or silicon oxynitride. Interfacial layer 126 may have a thickness of approximately 1.0 nanometers (nm) to approximately 1.2 nm. As used herein "approximately" is intended to include values, for example, within 10% of the stated values. In this example, the silicon dioxide of interfacial layer 126 may be formed by converting a portion of the silicon of fins 102 into silicon dioxide with the use of diluted hydrogen fluoric acid and ozone. That is, interfacial layer 126 may include a chemically formed silicon dioxide rather than a deposited silicon dioxide. Once silicon dioxide of interfacial layer 126 is formed, silicon oxynitride of interfacial layer 126 can be formed by rapid thermal processing (RTP) annealing in, for example, at least one of: nitrous oxide ($N_2O$), nitrogen oxide (NO), ammonia ($NH_3$), nitrogen gas ($N_2$), or ammonia in oxygen ($NH_3/O_2$). In other embodiments, silicon oxynitride of interfacial layer 126 may be formed without first forming silicon dioxide of interfacial layer 126 and vice versa.

Nitrided oxide layer 128 may be formed over interfacial layer 126 over fins 102. Nitrided oxide layer 128 may include, for example, nitrided silicon dioxide formed by either plasma nitridation or thermal nitridation of thermally grown or deposited oxide. In one embodiment, nitrided oxide layer 128 may have a nitrogen concentration in the range of approximately 12% to approximately 20% by atomic weight. Nitrided oxide layer 128 may be formed by a first deposition of silicon dioxide by a furnace atomic layer deposition (ALD) process at approximately 400° C. to a thickness of approximately 3.5 nm to approximately 5.0 nm. Subsequently, a plasma nitridation sequence of approximately 15% to 20% nitrogen may be performed followed by a subsequent anneal sequence of approximately 900° C. to approximately 1100° C. may be performed to the desired nitrogen content in the silicon dioxide. The nitrogen concentration in nitrided oxide layer 128 may be verifiable by X-Ray Photoelectron Spectroscopy (XPS). Further, interfacial layer 126 and nitrided oxide layer 128 may be etched, e.g., via diluted hydrofluoric acid (DHF), such that interfacial layer 126 and nitrided oxide layer 128 substantially surround fins 102. As used herein, "substantially" refers to largely, for the most part, entirely specified or any slight deviation which provides the same technical benefits of the invention.

Overlying nitride oxide layer 128 may be dummy gate material 130. As understood, dummy gate material 130 includes a material such as polysilicon that is placed where an active, metal or doped polysilicon gate will eventually be placed so that processing that would be harmful to the active gate can be carried out. Dummy gate material 130 may be formed by depositing dummy gate material and patterning using any now known or later developed photolithography technique. Dummy gate structures 124 may also include spacers 132 on opposing side of dummy gate material 130 and over fins 102 such that spacer 132 wraps around fins 102. Spacers 132 may include a hard mask material such as silicon nitride ($Si_3N_4$) to assist in protecting dummy gate material 130 and control further processing. Spacer material such as silicon nitride may be deposited and then etched to leave spacer 132 adjacent to dummy gate material 130.

Additionally, FINFET 100 may include an interlayer dielectric (ILD) layer 134 over fins 102 and adjacent to gate structures 124. ILD layer 134 may include a flowable chemical vapor deposited (FCVD) oxide, e.g., silicon oxide ($SiO_2$). However, ILD layer 134 may include other materials such as but not limited to: silicon nitride ($Si_3N_4$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. ILD layer 134 may be planarized to a top surface of gates structures 124. Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar.

Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

Figure 3:
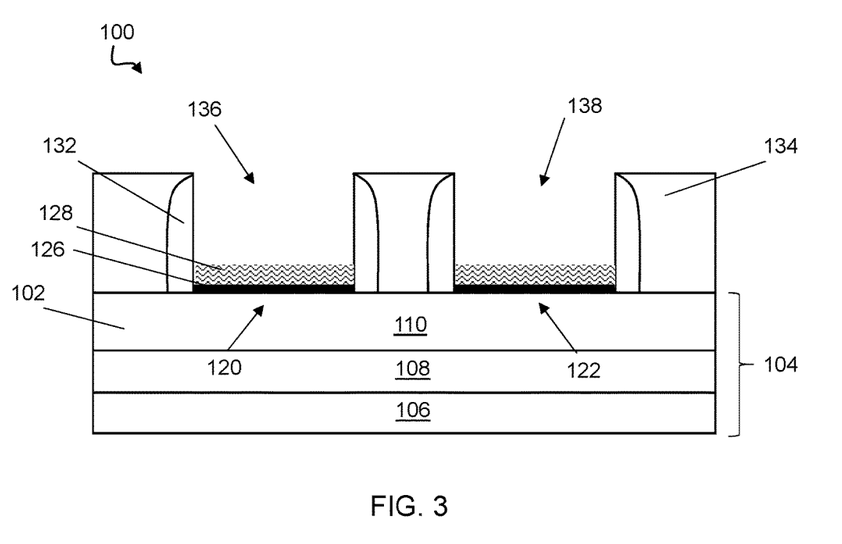

Referring now to FIG. 3, dummy gate material 130 (FIG. 2) may be removed from between spacers 132 to form opening 136 over nitrided oxide layer 128 over fin 102 in thin oxide device region 120 and opening 138 over nitrided oxide layer 128 over fin 102 in thick oxide device region 122. Dummy gate material 130 may be etched, e.g., via a wet etch process, such as, for example, a wet etch process using ammonium hydroxide ($NH_4OH$), or other similar chemistry, such that interfacial layer 126 and nitrided oxide layer 128 remain on the bottom of openings 136, 138.

Figure 4:
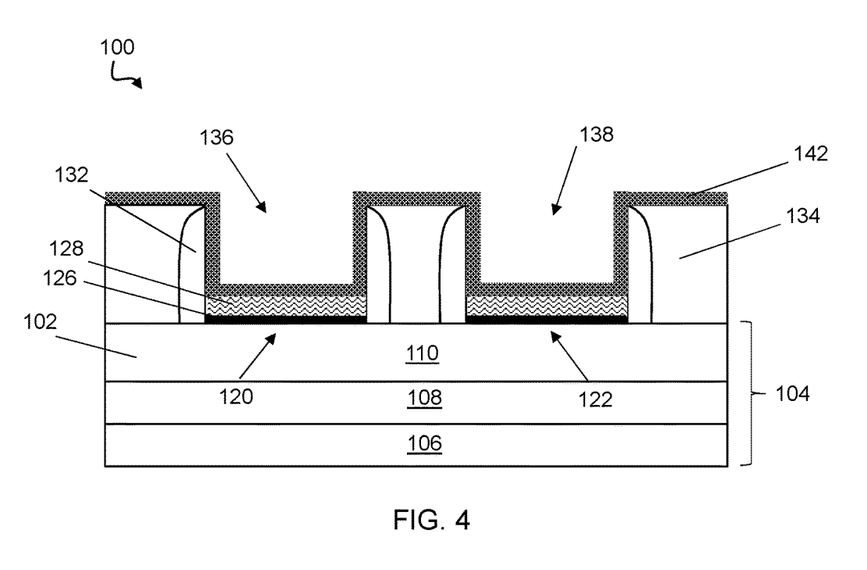

Referring now to FIG. 4, a conformal carbon hard mask 142 may be formed over nitrided oxide layer 128 over each fin 102 within openings 136, 138. Conformal carbon hard mask 142 may include amorphous carbon and may have some hydrocarbon in it (approximately 20% to approximately 30%). Conformal carbon hard mask 142 may be formed by, for example, plasma-enhanced chemical vapor deposition (PECVD) to a thickness of approximately 2.0 nm to approximately 3.0 nm.

Figure 5:
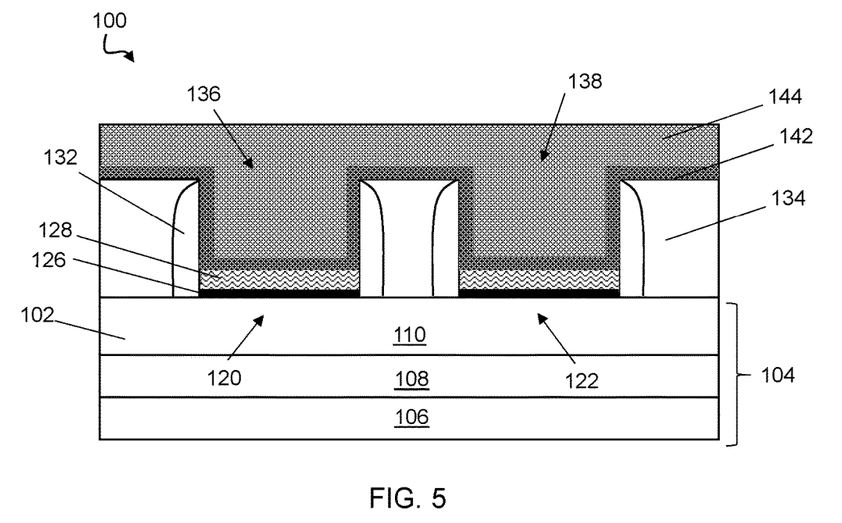
Figure 6:
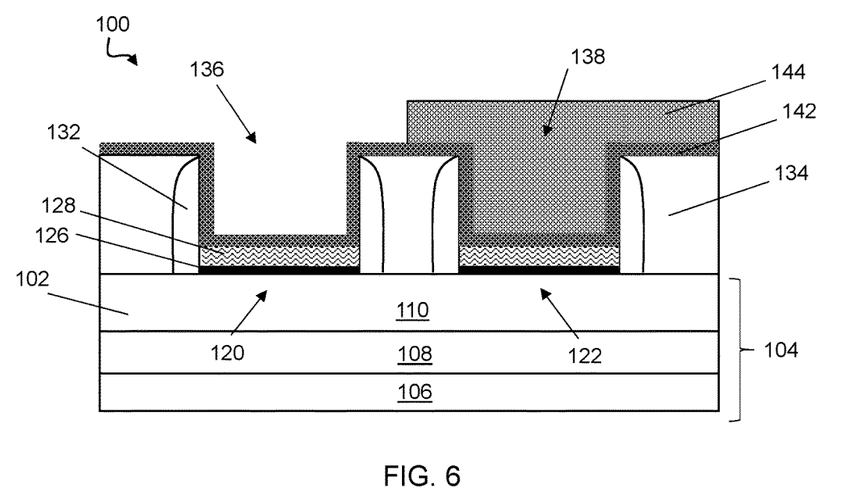

As shown in FIG. 5, a photoresist stack 144 may be formed over conformal carbon layer 142 over each fin 102. While photoresist stack 144 is shown as a single material, it is to be understood that photoresist stack 144 may include a plurality of layers together serving as a photoresist. For example, photoresist stack 144 may include an organic planarization layer, an anti-reflective coating layer, and a photoresist layer as is known in the art. Photoresist stack 144 may be patterned as shown in FIG. 6 such that photoresist stack 144 is removed from opening 136 in thin gate dielectric device region 120. That is, photoresist stack 144 may be removed, e.g., etched, from over thin oxide device region 120 to expose conformal carbon hard mask 142 thereunder, while photoresist stack 144 remains over thick gate dielectric device region 122.

Figure 7:
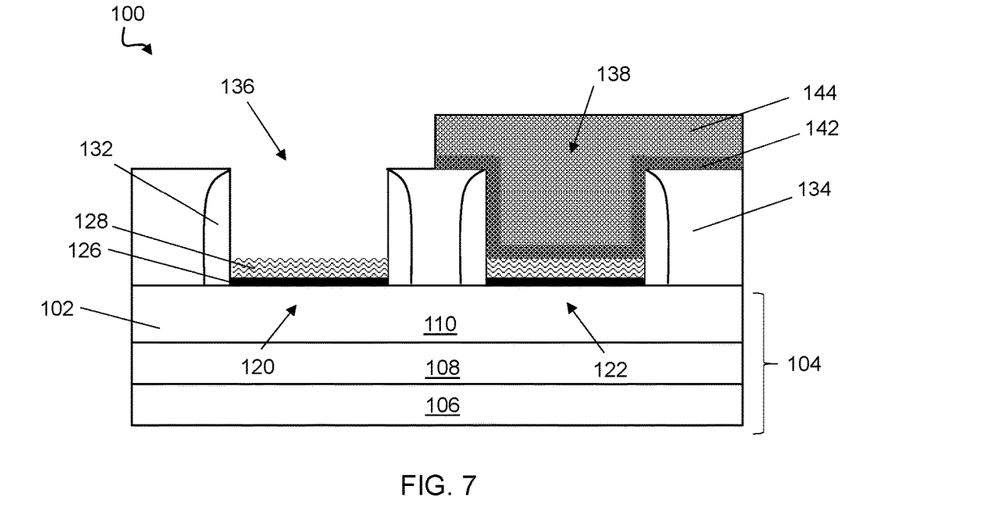

Referring now to FIG. 7, the exposed conformal carbon hard mask 142 (FIG. 6) may be removed from over fin 102 to expose nitrided oxide layer 128 over fin 102 in thin gate dielectric device region 120. Conformal carbon hard mask 142 may be removed, for example, by an-isotropic dry etching method with nitrogen, hydrogen or oxygen chemistry or a combination of thereof. The dry etching method may include a biased (having an electrical field) reactive ion etch process where the plasma is highly directional and removes the exposed conformal carbon hard mask 142 from over thin gate dielectric device region 120 without adversely affecting photoresist stack 144 protection over thick gate dielectric device region 122.

Figure 8:
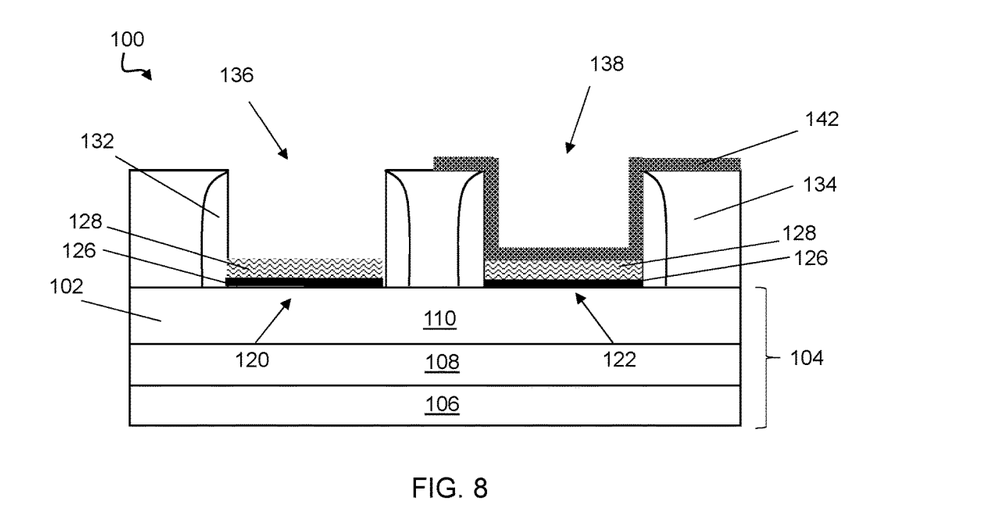

As shown in FIG. 8, the remaining portion of photoresist stack 144 (FIG. 7) that is over fin 102 in thick gate dielectric device region 122 may be removed, for example, by wet etching with low-temperature (less than approximately 200° C.) of diluted sulphuric oxide, to expose conformal carbon hard mask 142 in thick gate dielectric device region 122. This wet resist etch process is highly selective to the conformal carbon hard mask 142. Since fin 102 is still protected by conformal carbon hard mask 132 in thick gate dielectric device region 122, nitrided oxide 128 over fin 102 in thick gate dielectric device region 122 remains unaffected (or not damaged) by the removal of photoresist stack 144.

Figure 9:
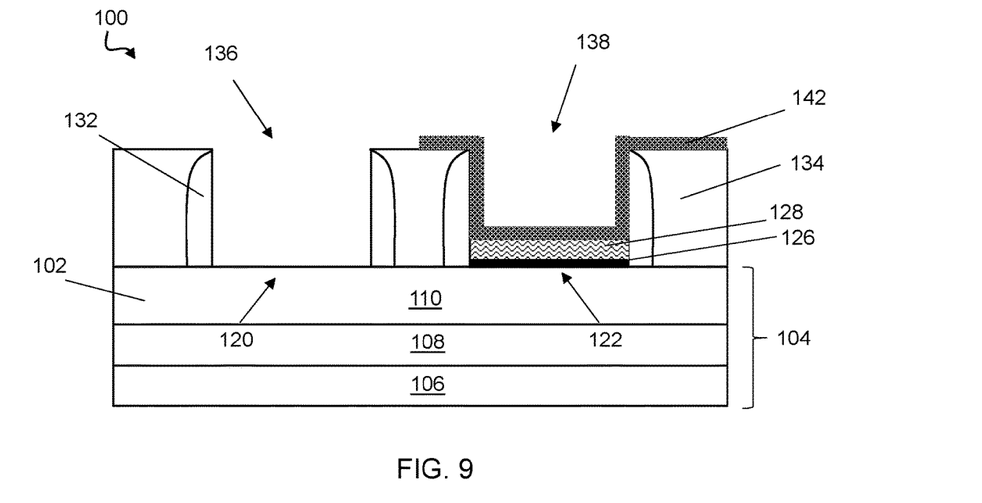

As shown in FIG. 9, nitrided oxide layer 128 (FIG. 8) and interfacial layer 126 (FIG. 8) may be removed from over fin 102 in thin gate dielectric device region 120. Nitrided oxide layer 128 and interfacial layer 126 may be removed by etching, for example, by a selective oxide removal process using SiCoNi. This type of etch may include a dry chemical local etch followed by sublimation of byproducts for removal. Since nitrided oxide layer 128 and interfacial layer 126 over 102 in thick gate dielectric device region 122 are protected by conformal hard mask 132, nitrided oxide 128 over fin 102 in thick gate dielectric device region 122 remains unaffected (or not damaged) by the removal of nitride oxide layer 126 and interfacial layer 128 in thin gate dielectric device region.

Figure 10:
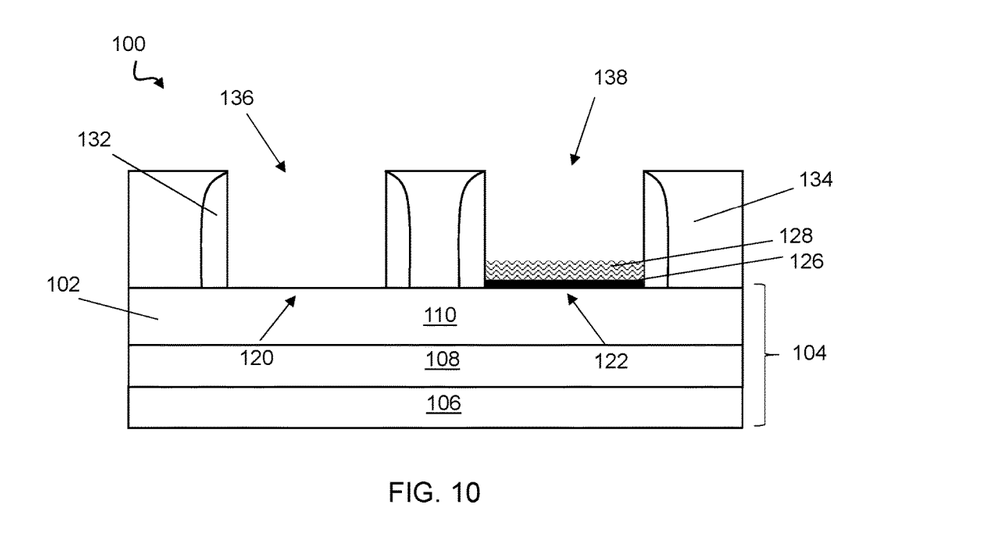

As shown in FIG. 10, the remaining conformal carbon hard mask 142 (FIG. 9) over fin 102 in thick gate dielectric region 122 may be removed to expose nitrided oxide layer 128 over fin 10 in thick gate dielectric region 122. In this process, conformal carbon hard mask 142 may be removed, for example, by an ashing process which is a selective isotropic dry etching with plasma formed by nitrogen, hydrogen, or oxygen chemistry or a combination thereof. This may be carried out using ashing equipment commonly found in semiconductor processing operations, or by using the requisite chemistry in a conventional plasma etch tool. Essentially, ashing involves burning away portions of conformal carbon hard mask 142 but is highly selective to nitrided oxide layer 128. The amount and magnitude of the reduction that may be accomplished by the ashing process may be controlled by varying one or more parameters of the ashing process. For example, the ashing chemistry, the power supplied during the ashing process, and/or the duration of the ashing process may be varied to affect the amount of the conformal carbon hard mask 142 removed in the ashing process. Ashing does not affect the nitrogen content of, or otherwise damage, nitrided oxide layer 128 over fin 102 in thick gate dielectric device region 122. In this case, the ashing does not include an oxygen ($O_2$) chemistry which may deplete the nitrogen content of nitride oxide layer 128.

Figure 11:
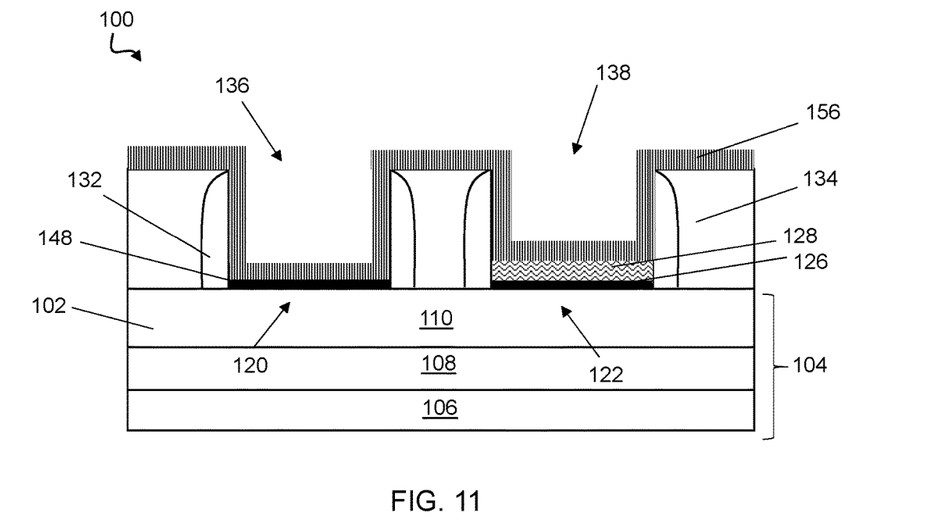

As shown in FIG. 11, another interfacial layer 148 may be formed in thin gate dielectric device region 120. Interfacial layer 148 may include any of the materials used for interfacial layer 126. In one example, interfacial layer 126 may include silicon dioxide which may be formed by converting a portion of the silicon of fins 102 into silicon dioxide with the use of diluted hydrogen fluoride and ozone. That is, interfacial layer 148 may be a chemically formed silicon dioxide rather than a deposited silicon oxide. In another example, interfacial layer 148 could include silicon oxynitride of interfacial layer 126 can be formed by RTP annealing, or both silicon dioxide and silicon oxynitride. Interfacial layer 148 may have a thickness of approximately 1.0 nm to approximately 1.2 nm. As shown in FIG. 11, interfacial layer 148 does not form over nitrided oxide layer 128 in thick gate dielectric device region 122. That is, interfacial layer 148 will only form over exposed silicon. Since no silicon is exposed over fin 102 in thick gate dielectric device region 122, interfacial layer 148 will not form within thick gate dielectric device region 122.

Figure 12:
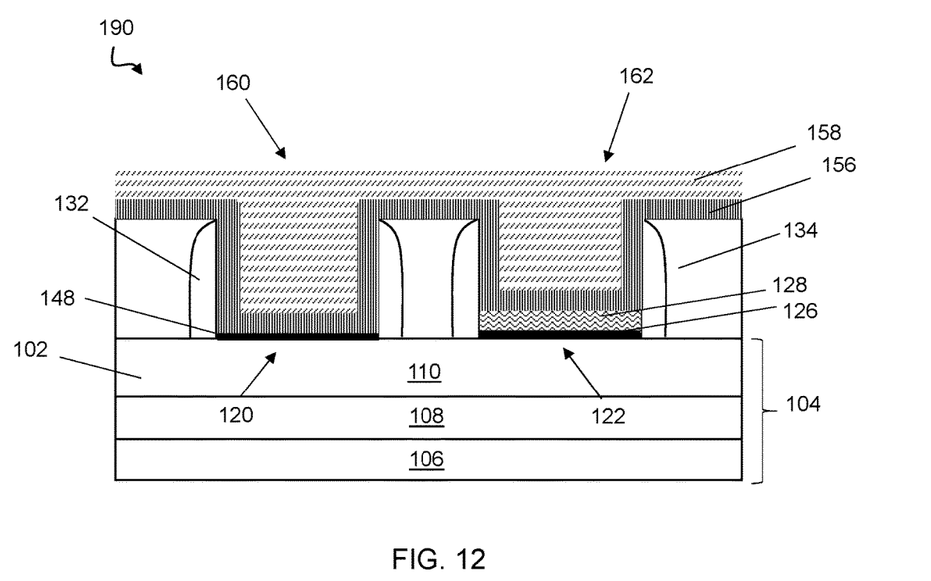

Still referring to FIG. 11, a layer having a high dielectric constant (high-k layer) 156 may be formed over each fin 102 in thin gate dielectric region 120 and thick gate dielectric region 122. That is, high-k layer 156 may be formed over interfacial layer 148 over fin 102 in thin gate dielectric device region 120 and over nitrided oxide layer 128 over fin 102 in thick gate dielectric device region 122. High-k layer 156 may include for example, hafnium silicate, hafnium oxide, zirconium silicate, zirconium oxide, silicon oxide, silicon nitride, silicon oxynitride, other high-k material having a dielectric constant greater than 3.9, or any combination of these materials. Integrated circuit structure 100 may undergo additional processing such as for example, providing work function metal layers (such as titanium nitride, tantalum nitride, aluminum, titanium aluminum, etc.) for the manufacturing of gate conductors 158 over high-k layer 156 over fins 102 to create a completed dual gate FINFET 190 as shown in FIG. 12. In some embodiment, the work function metal layers used for thin gate dielectric device 160 may be different from the work function metal layer used for thick gate dielectric device 162.

Still referring to FIG. 12, dual gate FINFET 190 may include a thin gate dielectric device 160 on substrate 104 in thin oxide device region 120 and a thick gate dielectric device 162 in thick device region 122 adjacent to thin gate dielectric device 160 on substrate 104. Thin gate dielectric device 160 may include fin 102 within substrate 104 and interfacial layer 148 over fin 102. Interfacial layer 148 may have a thickness of approximately 1.0 nm to approximately 1.2 nm. Overlying interfacial layer 148 may be high-k layer 156. Further, thin gate dielectric device 160 may also include gate conductor 158. Thick gate dielectric device 162 may include fin 102 within substrate 104 and interfacial layer 126 over fin 102. Additionally, thick gate dielectric device 162 may include nitrided oxide layer 128 over interfacial layer 126. Nitrided oxide layer 128 may include a thickness of approximately 3.5 nm to approximately 5.0 nm. Overlying nitrided oxide layer 128 may be high-k layer 156 and gate conductor 158. As discussed herein, the structure and processes described herein use conformal carbon hard mask 142 (FIG. 4) as an alternative to the conventional oxide hard mask that is typically used. Conformal carbon hard mask 142 used herein protects thick oxide device region 122 and can be removed from thick oxide device region 122 via ashing such that nitrided oxide layer 128 is not damaged or thinned during the removal of conformal carbon hard mask 142. That is, the formation and removal of conformal carbon hard mask 142 does not cause damage or depletion of the nitrogen content in nitrided oxide layer 128 within thick oxide device region 122.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of forming an integrated circuit structure including a thin gate dielectric device region over a set of fins within a substrate and a thick gate dielectric device region over the set of fins within the substrate, the method comprising:

forming a nitrided oxide layer over each fin in the set of fins within the thin gate dielectric device region and the thick gate dielectric device region;

forming a conformal carbon hard mask over the nitrided oxide layer within the thin gate dielectric device region and the thick gate dielectric device region;

patterning a photoresist stack over the conformal carbon hard mask within the thin gate dielectric device region and the thick gate dielectric device region to expose the conformal carbon hard mask within the thin gate dielectric device region such that a remaining portion of the photoresist stack remains within the thick gate dielectric device region;

removing the exposed conformal carbon hard mask from the thin gate dielectric device region such that a remaining portion of the conformal carbon hard mask remains within the thick gate dielectric device region covered by the remaining portion of the photoresist stack;

removing the remaining portion of the photoresist stack from over the remaining portion of the conformal carbon hard mask within the thick gate dielectric device region;

removing the remaining portion of the conformal carbon hard mask from the thick gate dielectric device region to expose the nitrided oxide within the thick gate dielectric device region; and forming an interfacial layer within the thin gate dielectric device region.

2. The method of claim 1, further comprising:

forming an initial interfacial layer over each fin in the set of fins within the thin gate dielectric device region and the thick gate dielectric device region prior to the forming of the nitrided oxide layer.

3. The method of claim 1, wherein the removing of the remaining portion of the photoresist stack from over the remaining portion of the conformal carbon hard mask from the thick gate dielectric device region includes performing a wet etch.

4. The method of claim 1, wherein the removing of the remaining portion of the conformal carbon hard mask from the thick gate dielectric device region includes ashing the conformal carbon hard mask.

5. The method of claim 1, further comprising:
removing the nitrided oxide layer from the thin gate dielectric device region after the removing of the remaining portion of the photoresist stack from over the remaining portion of the conformal carbon hard mask within the thick gate dielectric device region and prior to the removing of the remaining portion of the conformal carbon hard mask from the thick gate dielectric device region.

6. The method of claim 5, further comprising:
forming a layer having a high dielectric constant over the interfacial layer within the thin gate dielectric device region and over the nitrided oxide layer within the thick gate dielectric device region after the forming of the interfacial layer and oxide layer within the thin gate dielectric device region.

7. The method of claim 1, wherein the forming of the interfacial layer within the thin gate dielectric device region includes forming the interfacial layer within the thin gate dielectric device region without forming the interfacial layer within the thick gate dielectric device region.

8. The method of claim 1, wherein the nitrided oxide layer within the thick gate dielectric device region has a thickness of approximately 3.5 nanometers (nm) to approximately 5.0 nm.

9. The method of claim 1, wherein the interfacial layer within the thin gate dielectric device region has a thickness of approximately 1.0 nanometers (nm) to approximately 1.2 nm.

10. The method of claim 1, wherein the conformal carbon hard mask includes amorphous carbon.

11. The method of claim 1, wherein the forming of the conformal carbon hard mask over the nitrided oxide layer includes forming the conformal carbon hard mask to a thickness of approximately 2.0 nanometers (nm) to approximately 3.0 nm.

12. A method of forming an integrated circuit structure including a thin gate dielectric device region over a set of fins within a substrate and a thick gate dielectric device region over the set of fins within the substrate, the method comprising:
forming a nitrided oxide layer over each fin in the set of fins within the thin gate dielectric device region and the thick gate dielectric device region;
forming a conformal carbon hard mask over nitrided oxide layer within the thin gate dielectric device region and the thick gate dielectric device region;
patterning a photoresist stack over the conformal carbon hard mask within the thin gate dielectric device region and the thick gate dielectric device region to expose the conformal carbon hard mask within the thin gate dielectric region such that a remaining portion of the photoresist stack remains within the thick gate dielectric device region;
removing the exposed conformal carbon hard mask from the thin gate dielectric device region such that a remaining portion of the conformal carbon hard mask remains within the thick gate dielectric device region covered by the remaining portion of the photoresist stack;
wet etching to remove the remaining portion of the photoresist stack from over the remaining conformal carbon hard mask within the thick gate dielectric device region;
removing the nitrided oxide layer from the thin gate dielectric device region such that a remaining portion of the nitrided oxide layer remains within the thick gate dielectric device region covered by the remaining portion of the conformal carbon hardmask;
ashing the remaining portion of the conformal carbon hard mask to remove the remaining portion of the conformal carbon hard mask from the thick gate dielectric device region to expose the nitrided oxide layer within the thick gate dielectric device region; and
forming an interfacial layer within the thin gate dielectric device region.

13. The method of claim 12, further comprising:
forming an initial interfacial layer over each fin in the set of fins within the thin gate dielectric device region and the thick gate dielectric device region prior to the forming of the nitrided oxide layer.

14. The method of claim 13, wherein the removing of the nitrided oxide layer from the thin gate dielectric device region includes removing the initial interfacial layer from the thin gate dielectric device region.

15. The method of claim 14, further comprising:
forming a layer having a high dielectric constant over the interfacial layer within the thin gate dielectric device region and over the nitrided oxide layer within the thick gate dielectric device region after the forming of the interfacial layer within the thin gate dielectric device region.

16. The method of claim 12, wherein the forming of the interfacial layer within the thin gate dielectric device region includes forming the interfacial layer within the thin gate dielectric device region without forming the interfacial layer within the thick gate dielectric device region.

17. The method of claim 1, wherein the forming of the conformal carbon hard mask includes forming the conformal carbon hard mask including amorphous carbon having approximately 20% to approximately 30% hydrocarbon.

18. The method of claim 1, wherein the forming of the nitrided oxide layer over each fin in the set of fins includes:
depositing silicon dioxide via a furnace atomic layer deposition technique at approximately 400° C.;
performing a plasma nitridation sequence of approximately 15% to approximately 20% nitrogen on the silicon dioxide; and
performing an anneal at approximately 900° C. to approximately 1100° C. on the silicon dioxide.

\* \* \* \* \*